United States Patent
Xie et al.

(10) Patent No.: US 9,281,436 B2
(45) Date of Patent: Mar. 8, 2016

(54) RADIO-FREQUENCY SPUTTERING SYSTEM WITH ROTARY TARGET FOR FABRICATING SOLAR CELLS

(71) Applicant: Silevo, Inc., Fremont, CA (US)

(72) Inventors: Zhigang Xie, San Jose, CA (US); Wei Wang, San Jose, CA (US); Zheng Xu, Pleasanton, CA (US); Jianming Fu, Palo Alto, CA (US)

(73) Assignee: SolarCity Corporation, San Mateo, CA (US)

( * ) Notice: Subject to any disclaimer, the term of this patent is extended or adjusted under 35 U.S.C. 154(b) by 112 days.

(21) Appl. No.: 14/142,605

(22) Filed: Dec. 27, 2013

(65) Prior Publication Data

US 2014/0183037 A1    Jul. 3, 2014

Related U.S. Application Data

(60) Provisional application No. 61/747,081, filed on Dec. 28, 2012.

(51) Int. Cl.
*C23C 14/34* (2006.01)
*H01J 37/34* (2006.01)
(Continued)

(52) U.S. Cl.
CPC ........ *H01L 31/1876* (2013.01); *C23C 14/3407* (2013.01); *H01J 37/32082* (2013.01); *H01J 37/342* (2013.01); *H01J 37/345* (2013.01); *H01J 37/3405* (2013.01); *H01J 37/347* (2013.01); *H01J 37/3417* (2013.01); *H01J 37/3423* (2013.01); *H01J 37/3438* (2013.01);
(Continued)

(58) Field of Classification Search
CPC . H01J 37/342; H01J 37/3452; H01J 37/3444; H01J 37/3423; H01J 37/3405; H01J 37/3417; H01J 37/3438; H01J 37/345; H01J 37/347; C23C 14/3407
USPC .............. 204/298.21, 298.22, 192.12, 192.26
See application file for complete search history.

(56) References Cited

U.S. PATENT DOCUMENTS

| | | | |
|---|---|---|---|
| 2,626,907 A | 1/1953 | Melvin De Groote | |
| 2,938,938 A | 5/1960 | Dickson | |

(Continued)

FOREIGN PATENT DOCUMENTS

| | | |
|---|---|---|
| CN | 100580957 C | 1/2010 |
| CN | 104409402 | 3/2015 |

(Continued)

OTHER PUBLICATIONS

WP Leroy et al., "In Search for the Limits of Rotating Cylindrical Magnetron Sputtering", Magnetron, ION Processing and ARC Technologies European Conference, Jun. 18, 2010, pp. 1-32.

(Continued)

*Primary Examiner* — Rodney McDonald
(74) *Attorney, Agent, or Firm* — Shun Yao; Park, Vaughan, Fleming & Dowler LLP (57) ABSTRACT

One embodiment of the present invention provides a sputtering system for large-scale fabrication of solar cells. The sputtering system includes a reaction chamber, a rotary target situated inside the reaction chamber which is capable of rotating about a longitudinal axis, and an RF power source coupled to at least one end of the rotary target to enable RF sputtering. The length of the rotary target is between 0.5 and 5 meters.

20 Claims, 5 Drawing Sheets

(51) Int. Cl.
   *H01L 31/18* (2006.01)
   *H01J 37/32* (2006.01)

(52) U.S. Cl.
   CPC ......... *H01J37/3444* (2013.01); *H01J 37/3452* (2013.01); *H01L 31/1884* (2013.01); *Y02E 10/50* (2013.01)

(56) References Cited

U.S. PATENT DOCUMENTS

| | | |
|---|---|---|
| 3,094,439 A | 6/1963 | Mann |
| 3,116,171 A | 12/1963 | Nielson |
| 3,459,597 A | 8/1969 | Baron |
| 3,961,997 A | 6/1976 | Chu |
| 3,969,163 A | 7/1976 | Wakefield |
| 4,015,280 A | 3/1977 | Matsushita |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A * | 8/1981 | Weber ..................... 204/298.08 |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,633,033 A | 12/1986 | Nath |
| 4,652,693 A | 3/1987 | Bar-On |
| 4,667,060 A | 5/1987 | Spitzer |
| 4,670,096 A | 6/1987 | Schwirtlich |
| 4,694,115 A | 9/1987 | Lillington |
| 4,771,017 A | 9/1988 | Tobin |
| 4,784,702 A | 11/1988 | Henri |
| 4,877,460 A | 10/1989 | Flodl |
| 5,053,355 A | 10/1991 | von Campe |
| 5,075,763 A | 12/1991 | Spitzer |
| 5,118,361 A | 6/1992 | Fraas |
| 5,131,933 A | 7/1992 | Floedl |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A * | 11/1994 | Hartig et al. ............. 204/298.22 |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,814,195 A | 9/1998 | Lehan et al. |
| 5,903,382 A | 5/1999 | Tench |
| 5,935,345 A | 8/1999 | Kuznicki |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,441,297 B1 | 8/2002 | Keller |
| 6,488,824 B1 * | 12/2002 | Hollars et al. ............ 204/298.12 |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German et al. |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German et al. |
| 8,070,925 B2 | 12/2011 | Hoffman et al. |
| 8,168,880 B2 | 5/2012 | Jacobs |
| 8,182,662 B2 | 5/2012 | Crowley |
| 8,209,920 B2 | 7/2012 | Krause |
| 8,222,513 B2 | 7/2012 | Luch |
| 8,222,516 B2 | 7/2012 | Cousins |
| 8,343,795 B2 | 1/2013 | Luo |
| 8,586,857 B2 | 11/2013 | Everson |
| 2001/0008143 A1 | 7/2001 | Sasaoka |
| 2002/0086456 A1 | 7/2002 | Cunningham |
| 2002/0176404 A1 | 11/2002 | Girard |
| 2002/0189939 A1 * | 12/2002 | German et al. .......... 204/298.12 |
| 2003/0000571 A1 | 1/2003 | Wakuda |
| 2003/0042516 A1 | 3/2003 | Forbes |
| 2003/0070705 A1 | 4/2003 | Hayden |
| 2003/0097447 A1 | 5/2003 | Johnston |
| 2003/0121228 A1 | 7/2003 | Stoehr |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |
| 2004/0103937 A1 | 6/2004 | Bilyalov |
| 2004/0112426 A1 | 6/2004 | Hagino |
| 2004/0123897 A1 | 7/2004 | Ojima |
| 2004/0152326 A1 | 8/2004 | Inomata |
| 2005/0012095 A1 | 1/2005 | Niira |
| 2005/0022861 A1 | 2/2005 | Rose |
| 2005/0064247 A1 | 3/2005 | Sane |
| 2005/0109388 A1 | 5/2005 | Murakami |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2006/0012000 A1 | 1/2006 | Estes |
| 2006/0060238 A1 | 3/2006 | Hacke |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186970 A1 | 8/2007 | Takahashi |
| 2007/0202029 A1 | 8/2007 | Burns |
| 2007/0235829 A1 | 10/2007 | Levine |
| 2007/0274504 A1 | 11/2007 | Maes |

(56) References Cited

U.S. PATENT DOCUMENTS

| | | |
|---|---|---|
| 2007/0283996 A1 | 12/2007 | Hachtmann |
| 2007/0283997 A1 | 12/2007 | Hachtmann |
| 2008/0047602 A1 | 2/2008 | Krasnov |
| 2008/0047604 A1 | 2/2008 | Korevaar |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0149161 A1 | 6/2008 | Nishida |
| 2008/0156370 A1 | 7/2008 | Abdallah |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0230122 A1 | 9/2008 | Terakawa |
| 2008/0251117 A1 | 10/2008 | Schubert |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0078318 A1 | 3/2009 | Meyers |
| 2009/0084439 A1 | 4/2009 | Lu |
| 2009/0101872 A1 | 4/2009 | Young |
| 2009/0139585 A1 | 6/2009 | Lima |
| 2009/0151783 A1 | 6/2009 | Lu |
| 2009/0155028 A1 | 6/2009 | Boguslavskiy |
| 2009/0188561 A1 | 7/2009 | Aiken |
| 2009/0221111 A1 | 9/2009 | Frolov |
| 2009/0239331 A1 | 9/2009 | Xu |
| 2009/0250108 A1 | 10/2009 | Zhou |
| 2009/0255574 A1 | 10/2009 | Yu |
| 2009/0283138 A1 | 11/2009 | Lin |
| 2009/0283145 A1 | 11/2009 | Kim |
| 2009/0293948 A1 | 12/2009 | Tucci |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0108134 A1 | 5/2010 | Ravi |
| 2010/0116325 A1 | 5/2010 | Nikoonahad |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0169478 A1 | 7/2010 | Saha |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0269904 A1 | 10/2010 | Cousins |
| 2010/0300506 A1 | 12/2010 | Heng |
| 2010/0300507 A1 | 12/2010 | Heng |
| 2011/0146781 A1 | 6/2011 | Laudisio |
| 2011/0156188 A1 | 6/2011 | Tu |
| 2011/0168250 A1 | 7/2011 | Lin |
| 2011/0245957 A1 | 10/2011 | Porthouse |
| 2011/0259419 A1 | 10/2011 | Hagemann |
| 2011/0272012 A1 | 11/2011 | Heng |
| 2011/0277825 A1 | 11/2011 | Fu |
| 2011/0297227 A1 | 12/2011 | Pysch |
| 2012/0000502 A1 | 1/2012 | Wiedeman |
| 2012/0012174 A1 | 1/2012 | Wu |
| 2012/0028461 A1 | 2/2012 | Ritchie et al. |
| 2012/0031480 A1 | 2/2012 | Tisler |
| 2012/0040487 A1 | 2/2012 | Asthana |
| 2012/0085384 A1 | 4/2012 | Beitel |
| 2012/0125391 A1 | 5/2012 | Pinarbasi |
| 2012/0152349 A1 | 6/2012 | Cao |
| 2012/0192932 A1 | 8/2012 | Wu |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0305060 A1 | 12/2012 | Fu et al. |
| 2012/0318319 A1 | 12/2012 | Pinarbasi |
| 2012/0318340 A1 | 12/2012 | Heng |
| 2012/0325282 A1 | 12/2012 | Snow |
| 2013/0000705 A1 | 1/2013 | Shappir |
| 2013/0096710 A1 | 4/2013 | Pinarbasi |
| 2013/0152996 A1 | 6/2013 | DeGroot |
| 2013/0206213 A1 | 8/2013 | He |
| 2013/0206221 A1 | 8/2013 | Gannon |
| 2013/0247955 A1 | 9/2013 | Baba |
| 2014/0124013 A1 | 5/2014 | Morad |
| 2014/0124014 A1 | 5/2014 | Morad |
| 2014/0196768 A1 | 7/2014 | Heng |
| 2014/0345674 A1 | 11/2014 | Yang |

FOREIGN PATENT DOCUMENTS

| | | |
|---|---|---|
| DE | 4030713 | 4/1992 |
| DE | 102012010151 | 11/2013 |
| EP | 1770791 | 4/2007 |
| EP | 1806684 | 8/2007 |
| EP | 2362430 | 8/2011 |
| EP | 2385561 A2 | 11/2011 |
| EP | 2479796 A1 | 7/2012 |
| EP | 2626907 A1 | 8/2013 |
| JP | H04245683 A | 9/1992 |
| JP | H07249788 A | 9/1995 |
| JP | 2002095357 A | 2/2002 |
| JP | 2005159312 A | 6/2005 |
| KR | 20050122721 A | 12/2005 |
| KR | 20060003277 A | 1/2006 |
| KR | 20090011519 A | 2/2009 |
| WO | 9117839 | 11/1991 |
| WO | 9120097 A1 | 12/1991 |
| WO | 03083953 A1 | 10/2003 |
| WO | 2006097189 A1 | 9/2006 |
| WO | 2008089657 | 7/2008 |
| WO | 2009150654 A2 | 12/2009 |
| WO | 2010075606 A1 | 7/2010 |
| WO | 2010104726 A2 | 9/2010 |
| WO | 2010123974 A1 | 10/2010 |
| WO | 2011005447 A2 | 1/2011 |
| WO | 2011008881 A2 | 1/2011 |
| WO | 2011053006 | 5/2011 |
| WO | 2011123646 A2 | 10/2011 |
| WO | 2013020590 A1 | 2/2013 |
| WO | 2010085949 | 3/2013 |
| WO | 2014074826 | 7/2014 |

OTHER PUBLICATIONS

Beaucarne G et al: 'Epitaxial thin-film Si solar cells' Thin Solid Films, Elsevier-Sequoia S.A. Lausanne, CH LNKD- DOI:10.1016/J. TSF.2005.12.003, vol. 511-512, Jul. 26, 2006, pp. 533-542, XP025007243 ISSN: 0040-6090 [retrieved on Jul. 26, 2006].

Chabal, Yves J. et al., 'Silicon Surface and Interface Issues for Nanoelectronics,' The Electrochemical Society Interface, Spring 2005, pp. 31-33.

Collins English Dictionary (Convex. (2000). In Collins English Dictionary. http://search.credoreference.com/content/entry/hcengdict/convex/0 on Oct. 18, 2014).

Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%201.pptx> and converted to PDF.

Davies, P.C.W., 'Quantum tunneling time,' Am. J. Phys. 73, Jan. 2005, pp. 23-27.

Dosaj V D et al: 'Single Crystal Silicon Ingot Pulled From Chemically-Upgraded Metallurgical-Grade Silicon' Conference Record of the IEEE Photovoltaic Specialists Conference, May 6, 1975, pp. 275-279, XP001050345.

Green, Martin A. et al., 'High-Efficiency Silicon Solar Cells,' IEEE Transactions on Electron Devices, vol. ED-31, No. 5, May 1984, pp. 679-683.

(56) References Cited

OTHER PUBLICATIONS

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

JCS Pires, J Otubo, AFB Braga, PR Mei; The purification of metallurgical grade silicon by electron beam melting, J of Mats Process Tech 169 (2005) 16-20.

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

Merriam-Webster online dictionary—"mesh". (accessed Oct. 8, 2012).

Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.

Mueller, Thomas, et al. "High quality passivation for heterojunction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.

Stangl et al., Amorphous/Crystalline Silicon heterojunction solar cells—a simulation study; 17th European Photovoltaic Conference, Munich, Oct. 2001.

Warabisako T et al: 'Efficient Solar Cells From Metallurgical-Grade Silicon' Japanese Journal of Applied Physics, Japan Society of Applied Physics, JP, vol. 19, No. SUPPL. 19-01, Jan. 1, 1980, pp. 539-544, XP008036363 ISSN: 0021-4922.

Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011, p. 78402, XP020207379, ISSN: 1674-1056, DOI: 10.1088/1674-1056/20/7/078402.

\* cited by examiner

RADIO-FREQUENCY SPUTTERING SYSTEM WITH ROTARY TARGET FOR FABRICATING SOLAR CELLS

RELATED APPLICATION

This application claims the benefit of U.S. Provisional Application No. 61/747,081, entitled "Applying Radio-Frequency Sputtering to a Rotary Target System," by inventors Zhigang Xie, Wei Wang, Zheng Xu, and Jianming Fu, filed 28 Dec. 2012.

BACKGROUND

1. Field

This disclosure is generally related to a sputtering system used for fabricating solar cells. More specifically, this disclosure is related to a radio frequency (RF) sputtering system equipped with a rotary target.

2. Related Art

Anti-reflection coatings (ARCs) play an important role in ensuring high efficiency of silicon-based solar cells because the bare Si has a high surface reflection rate. Most ARCs include one or more layers of dielectrical material, such as $SiO_2$, $SiN_x$, etc. Moreover, many solar cells also include a thin layer of transparent conducting oxide (TCO) material (such as indium-tin-oxide (ITO) or indium doped zinc oxide (ZIO)), which may also act as an ARC layer, on their top surface to ensure good ohmic contact between the metal electrode and the underlying Si layers.

Among various film deposition techniques, sputtering has been widely used by solar cell manufacturers as a tool for depositing the ARC and/or TCO layers because it can provide a high-quality film with sufficiently low interface defect density ($D_{it}$), which is important for achieving high-efficiency solar cells. However, currently available sputtering systems for manufacturing PVDs often rely on applying a high direct-current (DC) voltage to the target, and may result in a charge build-up on floating-potential surfaces and arcing. The occurrence of arcing makes the plasma and the deposition process unstable and therefore unpredictable. To decrease the influence of the arcing effect, alternating voltages can be used to prevent charge build-up at the floating-potential surface. However, DC-pulsed sputtering usually cannot meet the low-damage requirement of high-efficiency solar cells.

SUMMARY

One embodiment of the present invention provides a sputtering system for large-scale fabrication of solar cells. The sputtering system includes a reaction chamber, a rotary target situated inside the reaction chamber which is capable of rotating about a longitudinal axis, and an RF power source coupled to at least one end of the rotary target to enable RF sputtering. The length of the rotary target is between 0.5 and 5 meters.

In a variation on the embodiment, the system further includes a power splitter coupled to the RF power source. The RF splitter is configured to split output of the RF power source into two portions and feed each of the two portions to one end of the rotary target.

In a further variation, the power splitter is configured to split the output of the RF source 50-50.

In a variation on the embodiment, the system further includes a plurality of magnets configured to generate a static magnetic field between the rotary target and a carrier that carries a plurality of solar cells.

In a further variation, the RF power source has an RF frequency of at least 13 MHz.

In a variation on the embodiment, the system further includes a capacitance tuner coupled to one end of the rotary target.

In a further variation, the system further includes a tuning mechanism configured to periodically tune the capacitance tuner over a predetermined capacitance range.

In a further variation, the predetermined capacitance range is between 0.5 nF and 50 nF.

In a further variation, the system further includes a coaxial cable configured to couple the capacitance tuner with one end of the rotary target.

In a variation on the embodiment, the rotary target includes one or more layers of ceramic materials. The ceramic materials include one or more of: a transparent conducting oxide (TCO) material and a dielectric material.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide an RF sputtering system equipped with a rotary target to ensure uniform film deposition and target erosion. To prevent a formation of a standing wave, in some embodiments, the RF power is split 50-50 and each portion is fed to one end of the rotary target. In alternative embodiments, one end of the rotary target is coupled to the RF power, and the other end is coupled to a capacitance tuner. By periodically tuning the capacitance tuner, one can achieve a relatively flat profile of the average voltage across the rotary target. A flat voltage profile ensures uniform target erosion. In further embodiments, increasing magnetic pole density at the plasma edge can further balance the erosion profile along the axis of the rotary target.

Electro-magnetic Field Distribution

Industrialized fabrications of solar cells often involve a relatively large film-deposition system. Some systems can include an inline feeding mechanism that feeds a wafer carrier that carries multiple solar cell wafers arranged into an m×n array into a deposition chamber. As the wafers pass through beneath (sometime above) the target, a thin layer of target material is deposited onto the wafer surface via reactive sputtering. For large-scale deposition, the size of the chamber can be up to a few meters long and over a meter wide. The size of a typical target used in such chambers can also be a few meters long.

Conventional sputtering systems often use planar targets that are often eroded non-uniformly in the sputter chamber and have a low target-utilization rate of around 30%. Moreover, when insulation targets, such as ceramic AZO targets are used, nodule formation and excessive arcing may occur, which further degrades target utilization and film quality. To prolong the target life and to reduce maintenance costs (switching out a target requires an interruption of the inline deposition process), sputtering systems with rotary targets have been used in large-scale solar cell fabrications.

When magnetron power is used during sputtering to confine the plasma, the use of a rotary target can also result in a cooler target because the magnetron power is spread out over a larger area in a given amount of time as the target is rotating continuously. Additional approaches used to reduce the nodule formation and occurrences of arcing also include usages of pulsed-DC power or AC (alternating current) power. However, pulsed-DC or AC sputtering often cannot provide a low-enough $D_{it}$ desirable for high-efficiency solar cells.

In order to obtain thin films with a low $D_{it}$, to prolong target lifetime, and to reduce maintenance costs (or the cost of ownership), in some embodiments, the sputtering system incorporates radio-frequency (RF) sputtering with a rotary target.

To apply RF sputtering, the rotary target is coupled to an RF power source; electromagnetic waves at the RF band travel along the axis of the rotary target and are confined between the surface of the target and the plasma body. A standard rotary target can be a cylindrical tube that is a few meters in length and 10-20 centimeters in diameter. Due to the boundary conditions, the transverse electromagnetic (TEM) mode is the only allowed propagating mode, with the electrical field (the E-field) in a direction normal to the target surface and the magnetic field (the B-field) in a direction tangential to the target surface. This oscillating electromagnetic field, along with the static magnetic field generated by the magnets, creates and maintains the collision and ionization, and the spiral motion of electrons.

Figure 1:
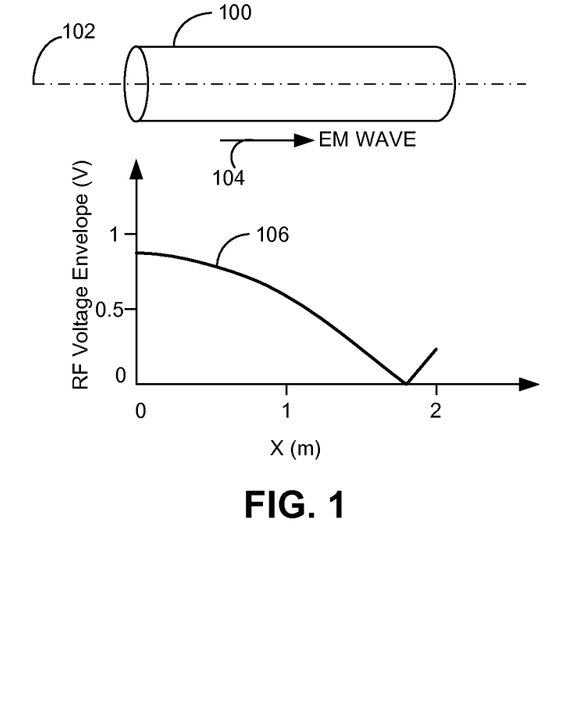
FIG. 1 presents a diagram illustrating an exemplary rotary target and a voltage distribution profile for across the rotary target under the condition of RF sputtering.

Typical frequencies used for RF sputtering are around tens of MHz, such as 13.56 MHz or 40 MHz, meaning the wavelength of the electromagnetic wave can range from a few meters (for higher frequency) to a few tens of meters (for lower frequency). Note that as the wavelength of the electromagnetic wave becomes comparable with the length of the rotary target, standing waves can form, which can then result in uneven sputtering, with the most sputtering at the anti-node and the least sputtering at the node of the standing wave. Such a sputtering pattern is determined by the voltage profile across the rotary target. In general, more target erosion occurs at points with a higher voltage. FIG. 1 presents a diagram illustrating an exemplary rotary target and a voltage distribution profile for across the rotary target under the condition of RF sputtering.

In FIG. 1, a rotary target 100 includes a cylinder that is capable of rotating about a longitudinal axis 102. Note that for the deposition of TCO materials, rotary target 100 may be a ceramic target with metal backings. Arrow 104 indicates the propagating direction of the electromagnetic wave. In the example shown in FIG. 1, the length of rotary target 100 is about 2 meters, and curve 106 indicates the voltage envelope along the longitudinal axis of target 100. In this example, an RF power source is coupled to one end of rotary target 100. As one can see from FIG. 1, the voltage distribution along longitudinal axis 102 is not uniform; node (where the voltage is zero) or anti-node (where the voltage is maximum) may exist, meaning that certain points may experience heavy erosion whereas a different point may experience lighter erosion. Note that such an uneven erosion profile can be problematic for continuous sputtering because the target cannot be effectively utilized. In addition, the non-uniform voltage profile can also result in a non-uniform film deposition.

A good sputtering system requires that the localized erosion rate should be more than the re-deposition rate in order to reduce particle contamination. This means that the sputtering system should have a node-less voltage profile along the longitudinal axis. To do so, in some embodiments, an RF sputtering system includes RF feeds coupled to both ends of the rotary target to eliminate the node in the voltage distribution profile.

Figure 2:
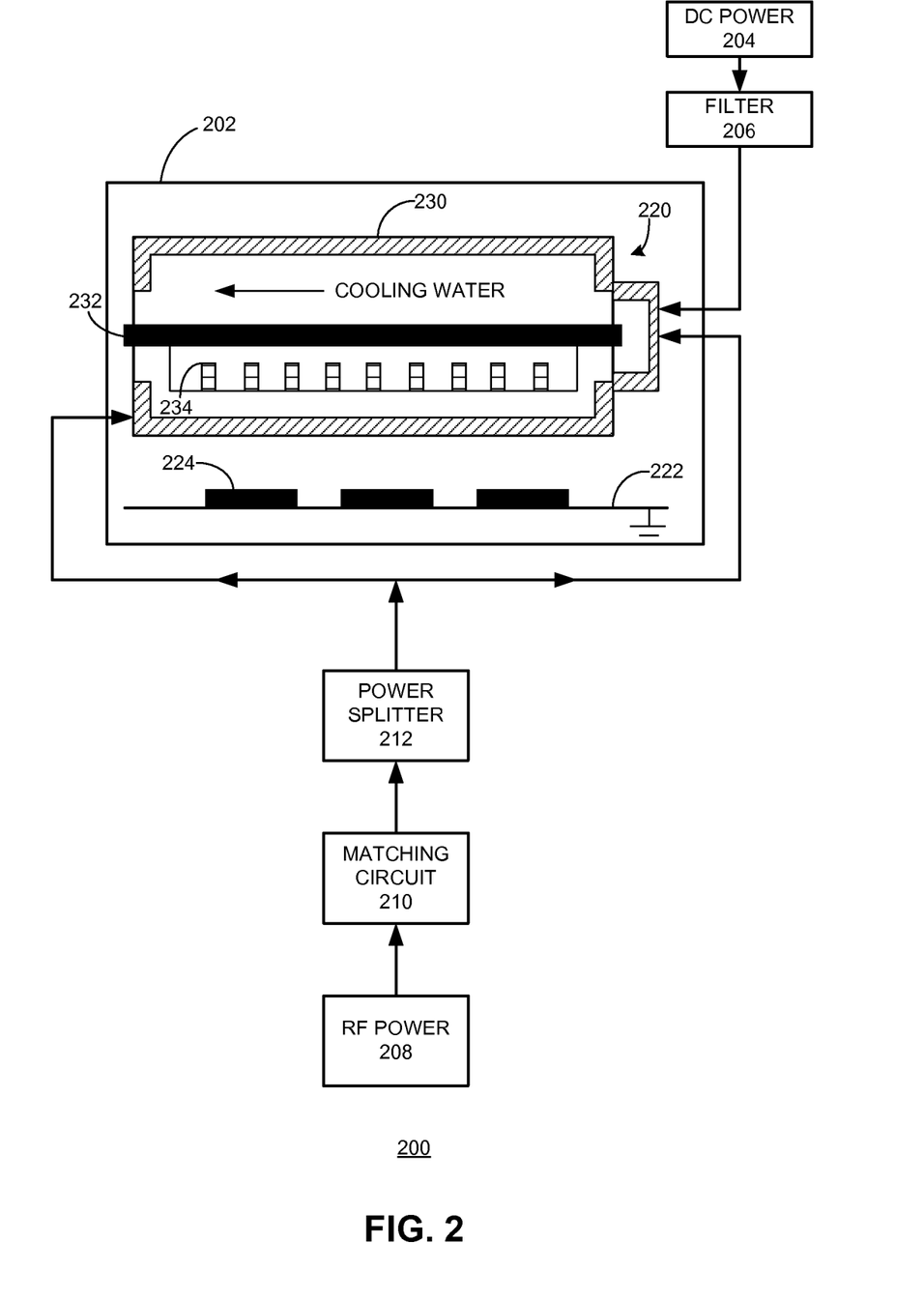
FIG. 2 presents an exemplary magnetron RF sputtering system with a rotary target, in accordance with an embodiment of the present invention.

FIG. 2 presents an exemplary magnetron RF sputtering system with a rotary target, in accordance with an embodiment of the present invention. In FIG. 2, RF sputtering system 200 includes a reactor chamber 202, a DC power source 204, a filter 206, an RF power source 208, an RF matching circuit 210, and a power splitter 212. Within reactor chamber 202 there is a rotary target 220 and a carrier 222. More specifically, rotary target 220 includes a cylindrical tube 230 capable of rotating about a longitudinal axis 232. In some embodiments, cylindrical tube 230 includes a metal backing tube (as indicated by the shaded areas) coated with ceramic powders. In some embodiments, cylindrical tube 230 includes one or more ceramic layers (with a thickness of up to a few centimeters) bonded to a metal backing tube. Note that the metal backing tube not only provides support to the ceramic layers but also acts as a conductor and a waveguide for the electromagnetic waves. The length of cylindrical tube 230 can be between 0.5 and 5 meters. In some embodiments, cylindrical tube 230 has a length between 2 and 3 meters. A number of stationary magnets, such as a stationary magnet 234, are mounted to longitudinal axis 232. These stationary magnets provide a stationary magnetic field, which confines the plasma in front of rotary target 220. To reduce heating, cooling water flows within cylindrical tube 230. In the example shown in FIG. 2, a carrier (also known as a pallet) 222, which carries a number of solar cells (such as a solar cell 224) for deposition, is placed beneath rotary target 220, and longitudinal axis 232 is parallel to the surface of carrier 222. In practice, the relative positions between rotary target 220 and carrier 222 can be different. In some embodiments, rotary target 220 may be placed in a position such that longitudinal axis 232 is vertical to the surface of carrier 222. Note that other standard components (such as a rotation mechanism that rotates the target continuously, load locks, and a gas delivery system) that are included in a sputtering system are not shown in FIG. 2.

DC power source 204 is coupled to one end of rotary target 220 via filter 206 to provide a static electrical field between rotary target 220 and grounded (or floating) carrier 222. Filter 206 acts as an AC blocker that blocks possible AC power leakage back to DC power source 204. RF power source 208 is coupled to both ends of rotary target 220 via matching circuit 210 and power splitter 212. Note that matching circuit 210 provides impedance matching between RF power source 208 and rotary target 220. Such matching is needed to provide maximum power transfer and to reduce RF reflection. In some embodiments, matching circuit 210 can include matching networks, such as a Pi matching network, a T matching network, and an L matching network.

Power splitter 212 splits the RF power into two separate portions and feeds each portion to one end of rotary target 220. In some embodiments, power splitter 212 splits the RF power 50-50, and the evenly split power is fed to both ends of rotary target 220. More specifically, each output of power splitter 212 is electrically coupled to one end of the metal tube included in cylindrical tube 230. Here, the metal tube acts as a waveguide for the RF wave, and the same power feeding at each end of the metal tube results in a symmetrical boundary condition for the waveguide. Note that assuming TEM mode is the only allowed propagation mode in the waveguide, the RF energy flux is transferred back and forth in the direction along longitudinal axis 232. One can model this distributed system to include a resistance (due to the skin effect in the RF regime) across rotary target 220, an inductance (due to the current flow in the direction along longitudinal axis 232), a conductance across the plasma sheath, and an effective capacitance between the surface of rotary target 220 and the plasma. Note that due to the magnetic field, the plasma is confined between rotary target 220 and carrier 222. In this modeling, voltage profile along longitudinal axis 232 is proportional to the vertical electrical field across the plasma sheath, and hence is more relevant to the ionization and local target erosion. In other words, a higher voltage means more target erosion. On the other hand, electrons follow a spiral motion primarily defined by the static magnetic field. Due to considerable scattering effects, the erosion groove can be smoothed out.

Figure 3:
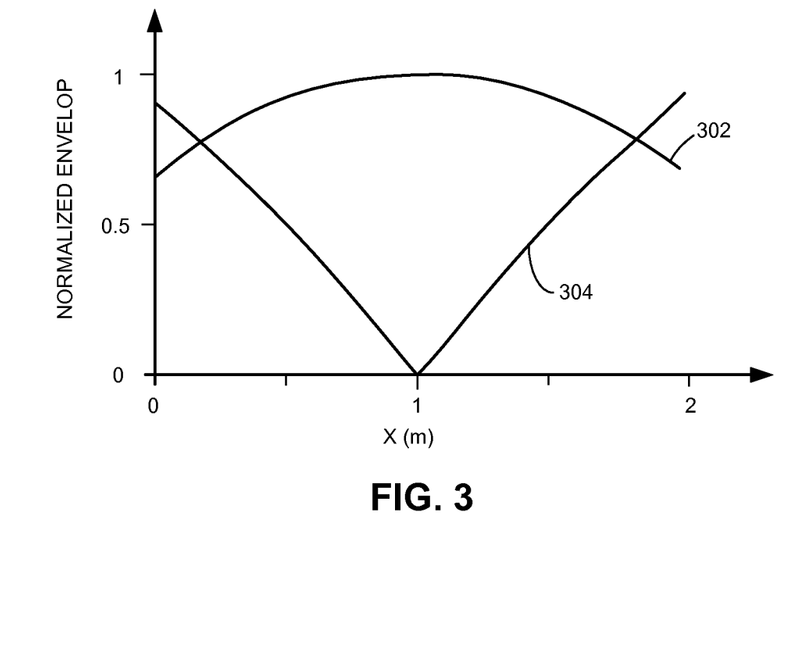
FIG. 3 presents a diagram illustrating exemplary voltage and current distribution profiles of a rotary target along its longitudinal axis during RF sputtering, in accordance with an embodiment of the present invention.

Based on the aforementioned model and the boundary condition (which is symmetrical if power splitter 212 is a 50-50 splitter), one can calculate the voltage and current distribution on rotary target 220 along its longitudinal axis 232. FIG. 3 presents a diagram illustrating exemplary voltage and current distribution profiles of a rotary target along its longitudinal axis during RF sputtering, in accordance with an embodiment of the present invention. In FIG. 3, curve 302 and curve 304 indicate the voltage and current profile across the rotary target, respectively. In the example shown in FIG. 3, the length of the rotary target is around 2 meters and the frequency of the RF power is assumed to be 40 MHz. Moreover, it is assumed that a power splitter evenly splits the RF power and feeds an equal portion to each end of the rotary target. As one can see from FIG. 3, the symmetrical boundary condition results in a symmetrical voltage and current distribution, with the voltage profile having an anti-node and the current profile having a node right in the middle of the rotary target. Note that by adjusting the power-splitting ratio and phase, one can move the locations of the anti-node and the node. Comparing FIG. 3 with FIG. 1, one can see that by feeding the RF power from both ends of the rotary target, one can remove the node in the voltage profile and obtain a more uniform voltage distribution. Such a relative uniform voltage profile across the rotary target is important for achieving relatively even erosion across the target. Consequently, the film deposition can be more uniform, and the target utilization can be increased.

In general, RF sputtering system 200 shown in FIG. 2 works well with RF powers at a lower frequency, such as the commonly used 13.56 MHz. However, to achieve thin films with $D_{it}$ matching the requirements of high-efficiency solar cells, RF powers at a higher frequency, such as 40 MHz or higher, are needed. At such a high frequency, the RF wavelength is very close to the length of the rotary target, meaning that considerable phase shifts exist on the rotary target from one end to the other, and thus, a considerable change in voltages across the target. As one can see in FIG. 3, although improved, the voltage profile (curve 302) still shows that the voltage at the center of the rotary target is significantly higher than the voltage at the end of the rotary target. In some embodiments, the stationary magnets are rearranged such that a stronger magnetic field can be achieved at the edge of the rotary target in order to even out the voltage profile. For example, one can increase the density of the magnets at locations closer to the edge of the rotary target. However, effects of such improvements can be limited and a better solution is still needed for higher frequency RF sputtering.

Figure 4:
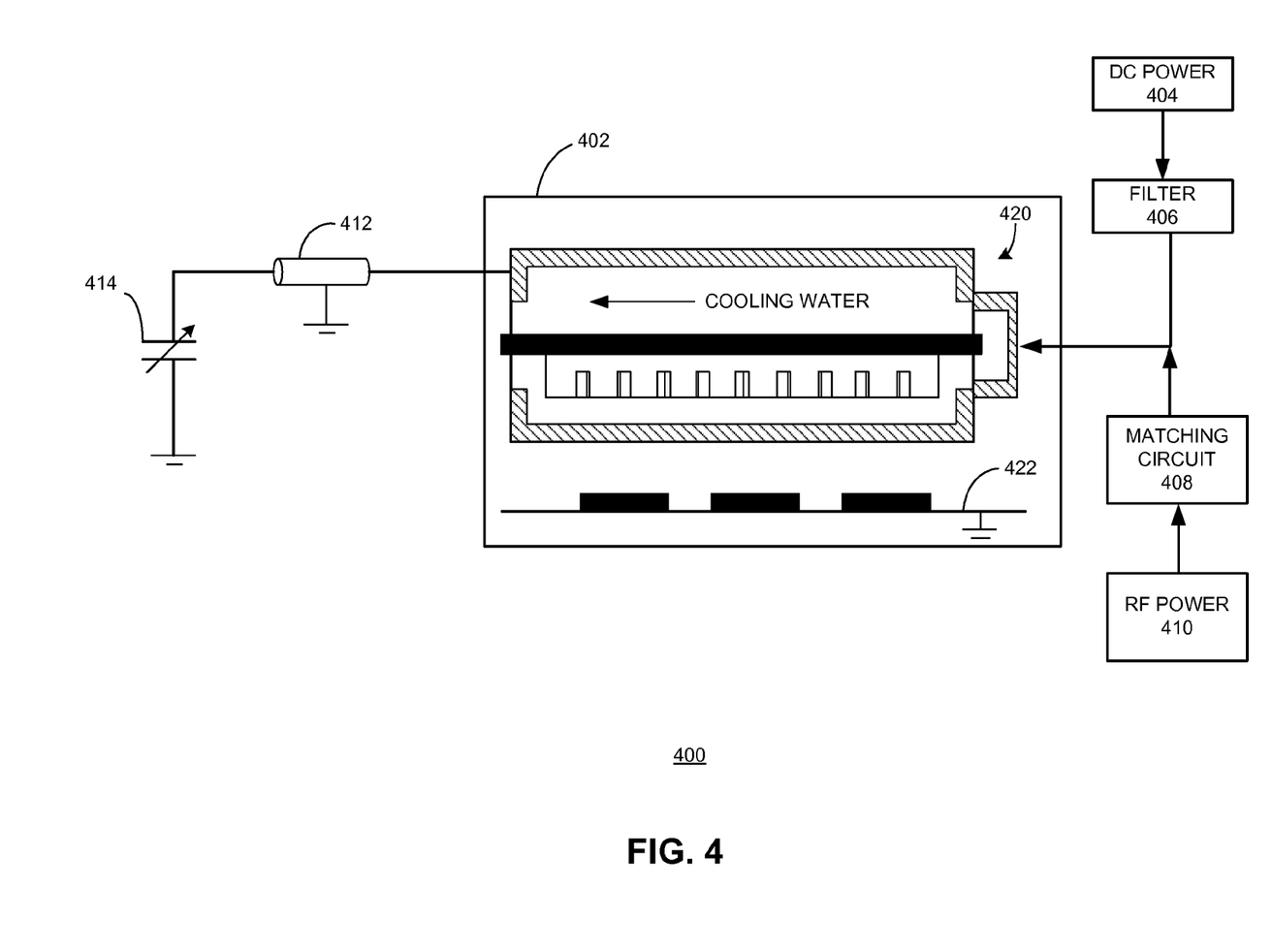
FIG. 4 presents a diagram illustrating an exemplary magnetron RF sputtering system with a rotary target, in accordance with an embodiment of the present invention.

To further improve the uniformity of the voltage distribution, especially in cases of higher frequency RF sputtering, in some embodiments, the RF sputtering system includes a capacitance tuner coupled to one end of the rotary target. By tuning the capacitance tuner over a certain range and averaging the overall effects, one can achieve a more uniform voltage profile along the longitudinal axis of the rotary target. FIG. 4 presents a diagram illustrating an exemplary magnetron RF sputtering system with a rotary target, in accordance with an embodiment of the present invention.

In FIG. 4, RF sputtering system 400 includes a reactor chamber 402, a DC power source 404, a filter 406, a matching circuit 408, an RF power source 410, a piece of coaxial cable 412, and a capacitance tuner 414. Similar to reactor chamber 202 shown in FIG. 2, reactor chamber 402 includes a rotary target 420 and a carrier 422. Rotary target 420 includes a cylindrical tube capable of rotating about its longitudinal axis, and a number of stationary magnets mounted on the longitudinal axis. To reduce the heating of the target, cooling water flows inside the cylindrical tube. Note that the cylindrical tube can include a metal backing tube and one or more ceramic layers on the surface of the metal tube. In some embodiments, the ceramic layers can include common TCO materials, such as ITO and IZO, and dielectric materials, such as $SiO_2$. The length of rotary target 420 can be between 0.5 and 5 meters. In some embodiments, rotary target 420 has a length of at least 2 meters to enable large-scale operations that are required in the manufacturing of solar cells. Moreover, carrier 422 is capable of carrying multiple solar cells for simultaneous film deposition on these cells.

Similar to the sputtering system shown in FIG. 2, DC power source 404 is coupled to one end of rotary target 420 (more specifically, electrically coupled to the metal backing tube) via filter 406 to provide a static electrical field between rotary target 420 and grounded carrier 422. Filter 406 acts as an AC blocker that blocks possible AC power leakage back to DC power source 404. Unlike the system shown in FIG. 2, in FIG. 4, RF power source 410 is coupled to only one end of rotary target 420 via matching circuit 408. In some embodiments, a single electrode can be used to couple rotary target 420 with DC power source 404 and RF power source 410.

Figure 5:
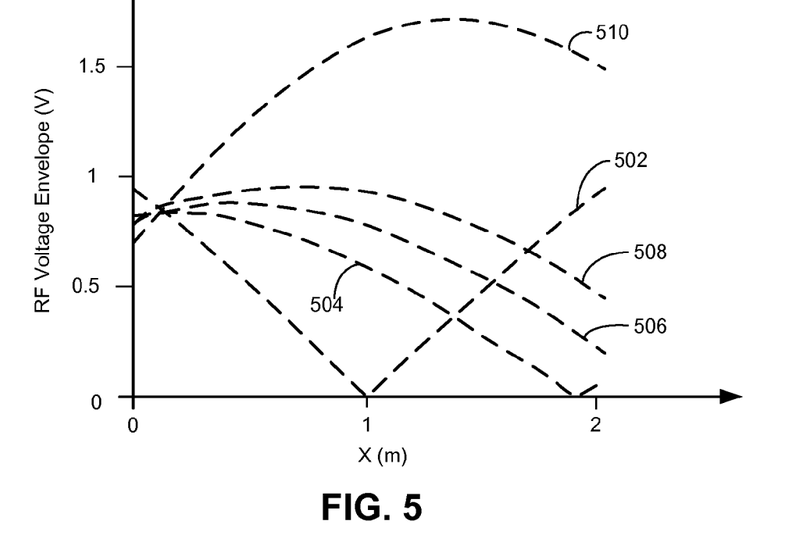
FIG. 5 presents a diagram illustrating the voltage profiles of the rotary target when the capacitance tuner is tuned to different capacitances, in accordance with an embodiment of the present invention.

The other end of rotary target 420 is coupled to capacitance tuner 414 via coaxial cable 412. Note that the grounded capacitance tuner 414 together with coaxial cable 412 can partially reflect electromagnetic wave, and create a tunable boundary condition. Note that the length and characteristics of coaxial cable 412 is carefully chosen to match the characteristic impedance of the target for TEM propagation in order to avoid unnecessary loss of RF energy. In one embodiment, coaxial cable 412 has a characteristic impedance of 50 ohm and is 10.2 feet long. By tuning the capacitance of capacitance tuner 414, one can move the location of the node (or anti-node) from one side of the rotary target to the other side of the rotary target, assuming linear tuning. FIG. 5 presents a diagram illustrating the voltage profiles of the rotary target when the capacitance tuner is tuned to different capacitances, in accordance with an embodiment of the present invention. In the example shown in FIG. 5, the length of the rotary target is approximately 2 meters, and the RF frequency is set at 40 MHz. Curve 502 represents the voltage distribution along the longitudinal axis of the rotary target when the capacitance tuner is tuned to 1.2 nF, and curves 504, 506, 508, and 510 are obtained when the capacitance tuner is tuned to 1.6 nF, 1.8 nF, 2 nF, and 4 nF, respectively. As one can see from FIG. 5, when the capacitance tuner is set at 1.2 nF, a node exists in the voltage profile approximately at the center of the rotary target. As the capacitance that is coupled to one end of the rotary target increases, the location of the node moves. For example, when the capacitance tuner is set at 1.6 nF, the voltage node moves to a location that is closer to an edge of the rotary target. Similarly, the location of the voltage anti-node also moves when the capacitance changes. Hence, by carefully tuning the capacitance tuner, we might be able to obtain a voltage profile that is relatively flat. For example, in FIG. 5, curve 508 may provide the most flat voltage distribution compared with other curves shown in FIG. 5. Moreover, by carefully arranging the magnets, one can further improve the voltage distribution uniformity, which is essential in obtaining a more uniform erosion profile.

Considering that the effect of target erosion takes time, one can obtain a more uniform voltage profile by averaging over time the different voltage profiles shown in FIG. 5. To do so, one can tune the capacitance tuner periodically. As long as the tuning period is much shorter compared with the deposition time (or the tuning frequency is much lower than the feeding speed of the inline sputtering system), the overall etching of the target during the deposition is averaged over the various settings of the capacitance tuner. In some embodiments, the capacitance tuner has a tuning range from 0.5 nF up to 50 nF (such as ranging from 1.2 nF to 4 nF), and the tuning frequency can range from a few Hz to a few tens of Hz. Depending on the configuration of the capacitance tuner, various methods can be used to periodically tune the capacitance tuner. In some embodiments, the capacitance tuner includes a mechanically controlled variable capacitor, such as a rotary variable capacitor, whose capacitance can be tuned by tuning the distance between the plates of the amount of overlapping plate surface areas. For example, the rotary variable capacitor can be coupled to a rotary motor. The constant rotation of the rotary motor periodically tunes the capacitance of the variable capacitor, and the tuning frequency can be determined by the speed of the rotary motor. In some embodiments, in addition to a capacitance tuner, the tunable boundary condition can also be provided by a tunable resistor, a tunable inductor, or a combination thereof. For example, a capacitance tuner can be coupled to a resistor, either in series or in parallel, to provide the needed tunable boundary condition.

Figure 6:
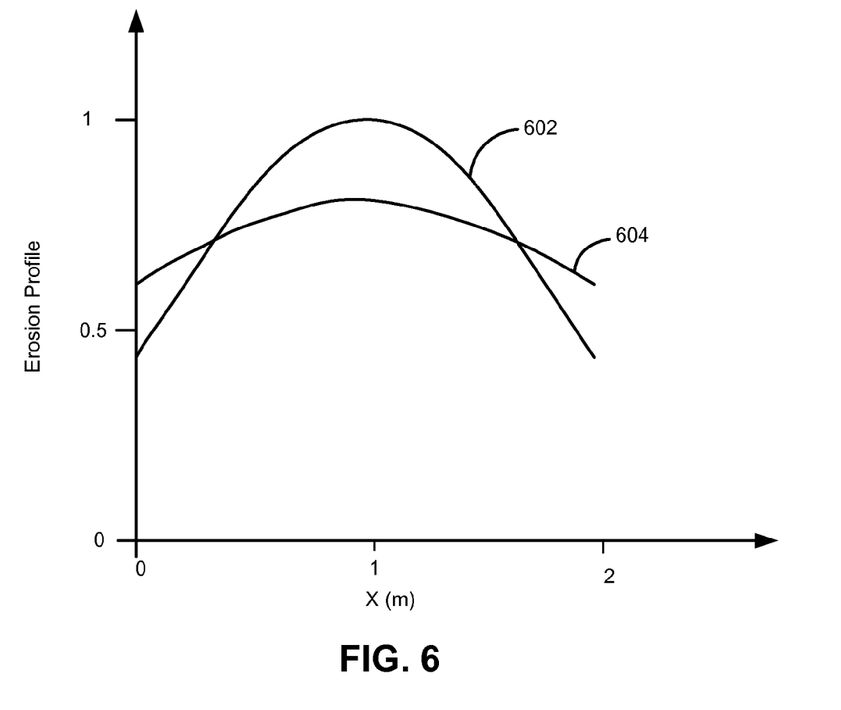
FIG. 6 presents a diagram illustrating exemplary target erosion profiles for different RF sputtering systems, in accordance with an embodiment of the present invention.

FIG. 6 presents a diagram illustrating exemplary target erosion profiles for different RF sputtering systems, in accordance with an embodiment of the present invention. Note that the erosion profile is proportional to the RF energy profile along the longitudinal axis of the rotary target. In FIG. 6, the RF frequency is approximately 40 MHz, and the target length is approximately 2 meters. Curve 602 indicates the target erosion profile for an RF sputtering system with fixed, symmetrical boundary conditions, such as the RF sputtering system shown in FIG. 2. Curve 604 indicates the target erosion profile of an RF sputtering system with continuously tuned boundary conditions, such as the RF sputtering system shown in FIG. 4. As one can see, with the continuously tuned boundary condition, the time-averaged erosion profile is much more uniform compared with the fixed, symmetrical boundary condition. In the example shown in FIG. 6, the capacitance tuner is tuned between 1.2 nf and 4 nf, and the coaxial cable has a characteristic impedance of 50 ohm and a length of 10.2 ft. Different erosion profiles can be obtained if these parameters are changed.

As one can see, even with the continuously tuned boundary condition, more erosion still occurs at the center of the target than at the edges. Such non-uniformity can be corrected by rearranging the stationary magnets as the erosion profile is also dependent on the magnetic field. In some embodiments, the stationary magnets may include an array of ferromagnetic pole pieces that are mechanically mounted to the longitudinal axis of the rotary target. Hence, by rearranging the magnets to have a higher density of pole pieces at both edges of the rotary target, we can further improve the target erosion uniformity.

Note that FIGS. 2 and 4 are merely schematic views of exemplary sputtering systems. Certain system components, such as rotation motors and wafer loading mechanisms, are not shown in FIGS. 2 and 4. Moreover, in practice, the shape and size of the chamber and chamber components, such as the rotary target and the magnets, can be different than the ones shown in FIGS. 2 and 4. In FIG. 4, the capacitance tuner is coupled to the end of the rotary target that is not coupled to the RF source. In practice, it is also possible to combine FIGS. 2 and 4 so that both ends of the rotary target are coupled to an RF power source, and at least one end of the rotary target is coupled to a capacitance tuner. As long as the rotary target has periodically tuned boundary conditions, it is possible to obtain a relatively uniform erosion profile because the time average of the voltage distributions is relatively flat. Note that the boundary conditions, which are determined by the tuning range of the capacitance tuner and the amount of RF power fed at each end, can be selected carefully to obtain the optimal erosion uniformity.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A sputtering system for large-scale fabrication of solar cells, comprising:
   a reaction chamber;
   a rotary target situated inside the reaction chamber, wherein the rotary target is configured to rotate about a longitudinal axis; and
   an RF power source coupled to the rotary target to enable RF sputtering, wherein a length of the rotary target is between 0.5 and 5 meters, wherein output of the RF power source is divided into two portions, and wherein each of the two portions is sent to one end of the rotary target.

2. The sputtering system of claim 1, wherein the output of the RF source is split into two equal portions.

3. The sputtering system of claim 1, further comprising a plurality of magnets configured to generate a static magnetic field between the rotary target and a carrier that carries a plurality of solar cells.

4. The sputtering system of claim 2, wherein the plurality of magnets are arranged in such a way that magnetic field is stronger at a location corresponding to an edge of the rotary target, thereby facilitating the magnetic field to have a higher strength at the edge of the rotary target.

5. The sputtering system of claim 1, wherein the RF power source has an RF frequency of at least 13 MHz.

6. The sputtering system of claim 1, further comprising a capacitance tuner coupled to one end of the rotary target.

7. The sputtering system of claim 6, further comprising a tuning mechanism configured to periodically tune the capacitance tuner over a predetermined capacitance range.

8. The sputtering system of claim 7, wherein the predetermined capacitance range is between 0.5 nF and 50 nF.

9. The sputtering system of claim 6, further comprising a coaxial cable configured to couple the capacitance tuner with one end of the rotary target.

10. The sputtering system of claim 1, wherein the rotary target includes one or more layers of ceramic materials, and wherein the ceramic materials include one or more of: a transparent conducting oxide (TCO) material and a dielectric material.

11. A sputter deposition method for large-scale fabrication of solar cells, comprising:
    placing a plurality of solar cells on a carrier within a reaction chamber;
    continuously rotating a rotary target about a longitudinal axis; and
    applying an RF power to the rotary target to enable RF sputtering of target material onto surfaces of the solar cells, wherein a length of the rotary target is between 0.5 and 5 meters, and wherein applying the RF power to the rotary target comprises:
    dividing the RF power into two portions; and
    feeding each of the two portions to an end of the rotary target.

12. The method of claim 11, wherein dividing the RF power into two portions involves dividing the RF power into two equal portions.

13. The method of claim 11, further comprising placing a plurality of magnets inside the rotary target to generate a static magnetic field between the rotary target and a carrier that carries a plurality of solar cells.

14. The method of claim 13, wherein placing the plurality of magnets involves arranging the magnets in such a way that magnetic field is stronger at a location corresponding to an edge of the rotary target, thereby facilitating the magnetic field to have a higher strength at the edge of the rotary target.

15. The method of claim 11, wherein the RF power has an RF frequency of at least 13 MHz.

16. The method of claim 11, further comprising:
    coupling a capacitance tuner to one end of the rotary target.

17. The method of claim 16, further comprising periodically tuning the capacitance tuner over a predetermined capacitance range.

18. The method of claim 17, wherein the predetermined capacitance range is between 0.5 nF and 50 nF.

19. The method of claim 16, further comprising inserting a coaxial cable between the capacitance tuner and one end of the rotary target.

20. The method of claim 11, wherein the rotary target includes one or more layers of ceramic materials, and wherein the ceramic materials include one or more of: a transparent conducting oxide (TCO) material and a dielectric material.

* * * * *